US012792172B2

(12) United States Patent
Hong et al.

(10) Patent No.: US 12,792,172 B2
(45) **Date of Patent: *Nov. 10, 2026**

(54) DISPLAY DEVICE

(71) Applicant: LG DISPLAY CO., LTD., Seoul (KR)

(72) Inventors: HyunSeok Hong, Gumi-si (KR); DongHun Jung, Paju-si (KR)

(73) Assignee: LG Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/211,645

(22) Filed: May 19, 2025

(65) Prior Publication Data

US 2025/0284354 A1 Sep. 11, 2025

Related U.S. Application Data

(63) Continuation of application No. 18/425,321, filed on Jan. 29, 2024, now Pat. No. 12,360,622, which is a (Continued)

(30) Foreign Application Priority Data

Nov. 10, 2021 (KR) ........................ 10-2021-0153946

(51) Int. Cl.
*G06F 3/041* (2006.01)
*H10K 50/844* (2023.01)
(Continued)

(52) U.S. Cl.
CPC ........ *G06F 3/0412* (2013.01); *G06F 3/04164* (2019.05); *G06F 3/0418* (2013.01); (Continued)

(58) Field of Classification Search
CPC .. G06F 3/04164; G06F 3/0443; G06F 3/0447; G06F 3/041; G06F 3/0412; G06F 2203/04103; G09G 3/3208
See application file for complete search history.

(56) References Cited

U.S. PATENT DOCUMENTS

| | | | | |
|---|---|---|---|---|
| 9,304,367 B2 * | 4/2016 | Wu | ...................... | H10D 89/811 |
| 10,692,957 B2 * | 6/2020 | Shin | ..................... | H10D 89/811 |

(Continued)

FOREIGN PATENT DOCUMENTS

| | | |
|---|---|---|
| CN | 107219660 A | 9/2017 |
| CN | 108877523 A | 11/2018 |

(Continued)

OTHER PUBLICATIONS

Combined Search and Examination Report in United Kingdom Appln. No. GB2506250.6, mailed on Jun. 4, 2025, 6 pages.

(Continued)

*Primary Examiner* — Olga V Merkoulova
(74) *Attorney, Agent, or Firm* — Fish & Richardson P.C.

(57) ABSTRACT

A display device includes substrate including a display area and a non-display area; an organic light emitting diode disposed on the substrate; an encapsulation layer disposed on the organic light emitting diode; a touch sensing unit disposed on the encapsulation layer in the display area; a plurality of pads disposed in the non-display area; a plurality of touch link lines disposed in the non-display area and each directly connected to the touch sensing unit; and an electrostatic discharge circuit disposed in the non-display area, wherein the non-display area includes a bending area and a pad area, and wherein the electrostatic discharge circuit is disposed between the bending area and the pad area.

20 Claims, 4 Drawing Sheets

Related U.S. Application Data continuation of application No. 17/903,127, filed on Sep. 6, 2022, now Pat. No. 11,921,943.

(51) Int. Cl.

| | |
|---|---|
| ***H10K 59/126*** | (2023.01) |
| ***H10K 59/131*** | (2023.01) |
| ***H10K 59/40*** | (2023.01) |
| *G06F 3/044* | (2006.01) |

(52) U.S. Cl.

CPC ......... *H10K 50/844* (2023.02); *H10K 59/126* (2023.02); *H10K 59/131* (2023.02); *H10K 59/40* (2023.02); *G06F 3/0446* (2019.05); *G06F 2203/04111* (2013.01)

(56) References Cited

U.S. PATENT DOCUMENTS

| | | | | |
|---|---|---|---|---|
| 10,707,280 | B2 * | 7/2020 | Jeong | G06F 3/04164 |
| 10,871,863 | B2 * | 12/2020 | Lee | H05K 9/0079 |
| 11,264,434 | B2 * | 3/2022 | Jeong | G06F 3/04164 |
| 2006/0119757 | A1 * | 6/2006 | Tsao | G02F 1/136204 349/40 |
| 2010/0238094 | A1 | 9/2010 | Cho et al. | |
| 2015/0108435 | A1 * | 4/2015 | Huh | H10K 50/8445 257/40 |
| 2015/0160522 | A1 * | 6/2015 | Wu | H10D 89/811 349/40 |
| 2015/0228928 | A1 * | 8/2015 | Kim | H10K 59/122 438/26 |
| 2016/0179229 | A1 * | 6/2016 | Ahn | G06F 3/0412 345/173 |
| 2018/0308903 | A1 * | 10/2018 | Jeong | G06F 3/04164 |
| 2019/0067409 | A1 | 2/2019 | Shin et al. | |
| 2019/0155417 | A1 * | 5/2019 | Lee | G06F 3/044 |
| 2020/0152707 | A1 | 5/2020 | Won et al. | |
| 2020/0286961 | A1 * | 9/2020 | Jeong | G06F 3/04164 |
| 2020/0350309 | A1 | 11/2020 | Long | |
| 2021/0013270 | A1 | 1/2021 | Yu et al. | |

FOREIGN PATENT DOCUMENTS

| | | | |
|---|---|---|---|
| CN | 109428000 | A | 3/2019 |
| CN | 111180484 | A | 5/2020 |
| KR | 20180119198 | A | 11/2018 |
| KR | 10-2020-0048797 | A | 5/2020 |

OTHER PUBLICATIONS

Office Action in Korean Appln. No. 10-2021-0153946, mailed on May 31, 2025, 11 pages (with English translation).

* cited by examiner

DISPLAY DEVICE

CROSS-REFERENCE TO RELATED APPLICATIONS

This application is a continuation of U.S. patent application Ser. No. 18/425,321, filed on Jan. 29, 2024, which is a continuation of U.S. patent application Ser. No. 17/903,127, filed on Sep. 6, 2022, which claims the priority of Korean Patent Application No. 10-2021-0153946 filed on Nov. 10, 2021, which are hereby incorporated by reference in their entirety.

BACKGROUND

Field of the Disclosure

The present disclosure relates to a display device, and more particularly, to a display device capable of suppressing electrostatic defects.

Description of the Background

A display device that displays various pieces of information on a screen is a key technology in the information and communication era, and has been developed in a direction of being thinner, lighter, portable and high-performance. Accordingly, an organic light emitting display device that displays an image by controlling the amount of light emitted from an organic light emitting diode, or similar technologies.

The organic light emitting diode is a self-light emitting element using a thin light emitting layer between two electrodes, and has an advantage of being thinner than backlit displays. A general organic light emitting display device has a structure in which a pixel driving circuit and an organic light emitting diode are formed on a substrate, and displays an image while light emitted from the organic light emitting diode passes through the substrate or a barrier layer.

The display device may accept a user's command through various input devices, and among them, a touch input device in which a user may intuitively and conveniently input a command by touching the display device has been widely used. The touch input device may be also referred to as a touch sensor or a touch sensing unit because it senses coordinates at which the touch input is made.

SUMMARY

Accordingly, the present disclosure is to provide a display device capable of suppressing electrostatic defects by discharging static electricity to the outside.

In addition, the present disclosure is to provide a display device capable of improving touch sensitivity by protecting internal elements and touch link lines from static electricity.

The present disclosure is not limited to the above-mentioned, and other features, which are not mentioned above, may be clearly understood by those skilled in the art from the following descriptions.

According to an aspect of the present disclosure, the display device includes: a substrate including a display area and a non-display area, an organic light emitting diode disposed on the substrate, an encapsulation layer disposed on the organic light emitting diode, a touch sensing unit disposed on the encapsulation layer in the display area, a touch pad disposed in the non-display area, a touch link line disposed in the non-display area and electrically connecting the touch sensing unit and the touch pad, and an electrostatic discharge circuit disposed in the non-display area and connected to the touch link line. In this case, because the electrostatic discharge circuit is connected to the touch link line, static electricity accumulated in the touch sensing unit is easily discharged to the outside, thereby suppressing electrostatic defects.

Other detailed matters of the aspects are included in the detailed description and the drawings.

Another aspect of the present disclosure, the display device includes: a substrate including a display area and a non-display area, a touch sensing unit including a touch electrode, and a connection electrode; a touch link line disposed in the non-display area and electrically connected to the touch sensing unit, a touch pad disposed in the non-display area, and an electrostatic discharge circuit disposed in the non-display area, in which the touch link line is electrically connected to the touch pad via the electrostatic discharge circuit.

According to the present disclosure, an electrostatic discharge circuit dedicated to a touch sensing unit is implemented in the display device to remove static electricity that may be generated during a manufacturing process and during touch input, thereby suppressing damage caused by static electricity.

The present disclosure prevents loss touch sensitivity of a display device and improves reliability by discharging static electricity that may be generated in the touch electrode and the touch link line.

The effects according to the present disclosure are not limited to the contents exemplified above, and more various effects are included in the present specification.

BRIEF DESCRIPTION OF THE DRAWINGS

The above and other aspects, features, and other advantages of the present disclosure will be more clearly understood from the following detailed description taken in conjunction with the accompanying drawings, in which.

DETAILED DESCRIPTION

Figure 1:
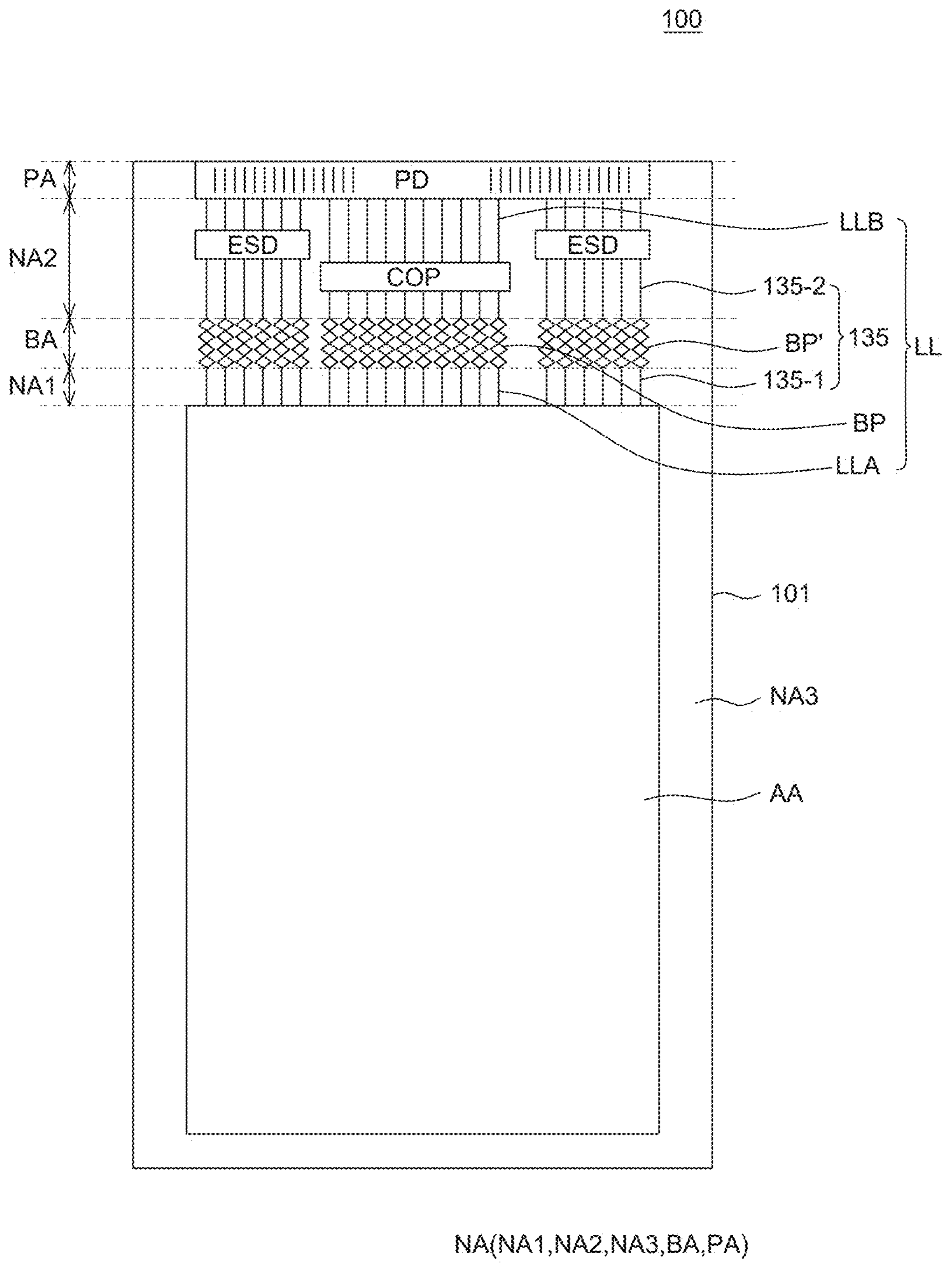
FIG. 1 is a plan view for schematically describing a display device according to an aspect of the present disclosure.

Advantages and characteristics of the present disclosure and a method of achieving the advantages and characteristics will be clear by referring to aspects described below in detail together with the accompanying drawings. However, the present disclosure is not limited to the aspects disclosed herein but will be implemented in various forms. The aspects are provided by way of example only so that those skilled in the art may fully understand the disclosures of the present disclosure and the scope of the present disclosure.

Therefore, the present disclosure will be defined only by the scope of the appended claims.

The shapes, sizes, ratios, angles, numbers, and the like illustrated in the accompanying drawings for describing the aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, a display device according to aspects of the present disclosure will be described in detail with reference to accompanying drawings.

FIG. 1 is a schematic plan view of a display device according to an aspect of the present disclosure. In FIG. 1, for convenience of description, only a substrate 101 of various components of a display device 100 is illustrated.

Referring to FIG. 1, the display device 100 includes a display area AA and a non-display area NA.

The display area AA is an area which is disposed with a plurality of pixels to display an image. A display unit for displaying an image and a circuit unit for driving the display unit may be formed in the display area AA. For example, when the display device 100 is an organic light emitting display device, the display unit may include an organic light emitting diode. That is, the display unit may include an anode, an organic layer on the anode, and a cathode on the organic layer. The organic layer may include, for example, a hole transport layer, a hole injection layer, an organic light emitting layer, an electron injection layer, and an electron transport layer. However, when the display device 100 is a liquid crystal display device, the display unit may also be configured to include a liquid crystal layer. Hereinafter, for convenience of description, it is assumed that the display device 100 is the organic light emitting display device, but the present disclosure is not limited thereto. The circuit unit may include various transistors, capacitors, and lines for driving the organic light emitting diode. For example, the circuit unit may consist of various components such as a driving transistor, a switching transistor, a storage capacitor, a gate line, a data line, and the like, but is not limited thereto.

The non-display area NA is an area in which no image is displayed, and is an area in which lines, circuits, and the like for driving the display unit disposed in the display area AA are disposed. In addition, various integrated circuits (ICs) such as a gate driver IC and a data driver IC and a chip-on-film (COF), a flexible printed circuit board (FPCB), etc. in which driving circuits may be disposed in the non-display area NA.

The non-display area NA may be defined as an area extending from the display area AA as illustrated in FIG. 1. However, the present disclosure is not limited thereto, and the non-display area NA may be defined to include an area surrounding the display area AA. In addition, the non-display area NA may also be defined as extending from a plurality of sides of the display area AA.

Referring to FIG. 1, the non-display area NA includes a first non-display area NA1, a bending area BA, a second non-display area NA2, a pad area PA, and a third non-display area NA3. The first non-display area NA1 is an area extending from the display area AA, and the bending area BA is an area extending from the first non-display area NA1 and may be bendable. The second non-display area NA2 is an area extending from the bending area BA, and the pad area PA is an area extending from the second non-display area NA2 and may be disposed with a plurality of pads PD. The third non-display area NA3 is an area that surrounds the display area AA together with the first non-display area NA1, and may also be disposed with a driving circuit referred to as a gate-in-panel (GIP) and the like.

A plurality of data lines and a touch sensing unit are disposed in the display area AA, and a plurality of data lines and a plurality of link lines LL connected to the touch sensing unit are disposed in the non-display area NA.

The plurality of link lines LL transmit signals from a driving circuit, a gate driver IC, a data driver IC, a touch driving circuit, etc., which may be disposed in the non-display area NA or may be disposed on a separate flexible film connected to lines disposed in the display area AA. Referring to FIG. 1, the plurality of link lines LL may include a plurality of data link lines and a plurality of touch link lines 135. However, the plurality of link lines LL is not limited thereto, and may include a plurality of gate link lines and link lines that may be connected to various lines such as a high potential voltage line and a low potential voltage line.

The plurality of data link lines transfers signals from the pad PD and the driving IC COP to the data line of the display area AA. That is, the plurality of data link lines connects the plurality of pads PD to the plurality of data lines, respectively. Accordingly, the plurality of data link lines may transmit data voltages to the plurality of data lines.

The plurality of data link lines are disposed between the pad area PA and the display area AA and may be centrally disposed in a portion of the non-display area NA extending from one side of the display area AA as illustrated in FIG. 1, but are not limited thereto. The plurality of data link lines includes a first line LLA disposed in the first non-display area NA1, a data bending pattern BP disposed in the bending area BA, and a second line LLB disposed in the second non-display area NA2.

The first line LLA of the data link line may extend from the data line of the display area AA and be disposed in the first non-display area NA1. The first line LLA may be connected to the data bending pattern BP, and may transmit a signal transmitted to the data bending pattern BP to the data line of the display area AA.

The data bending pattern BP of the data link line is disposed in the bending area BA. As described above, the bending area BA is an area that extends from the first non-display area NA1 and is an area bent in a bending direction on a final product. Accordingly, the data bending pattern BP may be formed in a pattern having a specific shape to minimize stress and cracks (e.g., electrical discontinuities) that may occur in the data link line in the bending area BA. For example, the data bending pattern BP may be a pattern in which conductive patterns having at least one of a diamond shape, a rhombus shape, a zigzag shape, and a circular shape are repeatedly disposed. However, the present disclosure is not limited thereto, and the shape of the data bending pattern BP may be various shapes to minimize stress and cracks on the data link line.

In FIG. 1, it is illustrated that the data bending pattern BP is disposed only in the bending area BA, but the present disclosure is not limited thereto. The data bending pattern BP may be further disposed even in partial areas on the first non-display area NA1 and the second non-display area NA2 other than the bending area BA. For example, the data bending pattern BP may also be disposed on a portion of the first non-display area NA1 and a portion of the second non-display area NA2 adjacent to the bending area BA.

The second line LLB of the data link line may extend from the data bending pattern BP of the bending area BA and be disposed in the second non-display area NA2. The second line LLB may be disposed between the data bending pattern BP and the pad PD to transmit a signal. In addition, referring to FIG. 1, since a driving IC COP is disposed in the second non-display area NA2, the driving IC COP may be connected to the second line LLB. A data signal may be supplied to the data line through the driving IC COP, and the second line LLB serves to transmit the signal.

The data link line may be formed of a conductive material, and may be formed of a conductive material having excellent ductility to minimize cracks from occurring when a flexible substrate 101 is bent. For example, the first line LLA and the second line LLB of the data link line may be formed of one of the various materials used in manufacturing the organic light emitting diode of the display area AA and the gate electrode, the source electrode, and the drain electrode of the transistor, and may be configured in a single layer or a multilayer. Specifically, the first line LLA and the second line LLB may be formed of molybdenum (Mo), chromium (Cr), titanium (Ti), nickel (Ni), neodymium (Nd), copper (Cu), an alloy of silver (Ag) and magnesium (Mg), and the like.

The plurality of touch link lines 135 transmits signals from the pad PD to the touch sensing unit of the display area AA. That is, the plurality of touch link lines 135 connects each of the plurality of touch pads to each of the touch electrodes of the touch sensing unit. Accordingly, the plurality of touch link lines 135 may transmit a touch voltage to the plurality of touch electrodes.

The plurality of touch link lines 135 is also disposed between the pad area PA and the display area AA like the plurality of data link lines. Referring to FIG. 1, the plurality of touch link lines 135 may be divided into two sets and disposed adjacent to both sides of the plurality of data link lines, but the present disclosure is not limited thereto. The plurality of touch link lines 135 may include a first touch link line 135-1 disposed in the first non-display area NA1, a touch bending pattern BP' disposed in the bending area BA, and a second touch link line 135-2 disposed in the second non-display area NA2.

The first touch link line 135-1 of the touch link line 135 may extend from the touch sensing unit of the display area AA and be disposed in the first non-display area NA1. The first touch link line 135-1 may be connected to the touch bending pattern BP', and may transmit a signal, which was transmitted to the touch bending pattern BP', to the touch electrode of the display area AA.

The touch bending pattern BP' of the touch link line 135 is disposed in the bending area BA. Similar to the data bending pattern BP of the data link line, the touch bending pattern BP' may be formed in a pattern having a specific shape to minimize stress and cracks within the touch link line 135 in the bending area BA. For example, the touch bending pattern BP' may be a pattern in which conductive patterns having at least one of a diamond shape, a rhombus shape, a zigzag shape, and a circular shape are repeatedly disposed. However, the present disclosure is not limited thereto, and the shape of the touch bending pattern BP' may be various shapes to minimize the stress and cracks within the touch link line 135.

FIG. 1 illustrates that the touch bending pattern BP' is disposed only in the bending area BA, but the present disclosure is not limited thereto. Similar to the data bending pattern BP of the data link line, the touch bending pattern BP' may be further disposed in partial areas of the first non-display area NA1 and the second non-display area NA2.

The second touch link line 135-2 of the touch link line 135 may extend from the touch bending pattern BP' of the bending area BA and be disposed in the second non-display area NA2. The second touch link line 135-2 may be disposed between the touch bending pattern BP' and the touch pad to transmit a signal. In addition, referring to FIG. 1, because an electrostatic discharge circuit ESD is disposed in the second non-display area NA2, the electrostatic discharge circuit ESD may be connected to the second touch link line 135-2. By discharging static electricity that may be generated in the touch sensing unit through the electrostatic discharge circuit ESD, it is possible to suppress damage caused by the static electricity.

The touch link line 135 may be made of the same material as that of the touch electrode, or may be made of a conductive material different from that of the touch electrode. For example, the touch link line 135 may be formed of a low-resistance metal. Examples materials for the touch link line include molybdenum (Mo), aluminum (Al), chromium (Cr), gold (Au), silver (Ag), titanium (Ti), nickel (Ni), neodymium (Nd), and copper (Cu) or alloys thereof. In addition, if the touch link line 135 is made of the same material as that of the touch electrode, the touch link line 135 may be made of a transparent conductive material such as indium tin oxide (ITO) and indium zinc oxide (IZO), but is not limited thereto.

In addition to the plurality of link lines LL, the plurality of pads PD may be disposed in the non-display area NA as described above. The plurality of pads PD are disposed in the pad area PA, and the pad area PA is an area extending from the second non-display area NA2. The plurality of pads PD may include a data pad, a touch pad, and the like. In addition, the plurality of pads PD may be connected to the plurality of link lines LL.

The driving IC COP may be disposed in the non-display area NA. Referring to FIG. 1, the driving IC COP may be disposed in the second non-display area NA2. The driving IC COP includes a data driving IC that supplies data signals to data lines disposed on the substrate 101, a gate driving IC, and the like. That is, the driving IC COP may be connected to a plurality of gate link lines and a plurality of data link lines. FIG. 1 illustrates a simplified version of the data driving IC for illustrative purposes, and the present disclosure is not limited thereto. The driving IC may be mounted on the substrate in a chip on plastic (COP) method. Referring to FIG. 1, the driving IC COP may be disposed between the bending area BA and the pad area PA. Accordingly, when the bending area BA is bent, the driving IC COP may be bent together with a connection interface such as a pad PD and positioned at the rear side of the display device 100.

In addition, the electrostatic discharge circuit ESD is configured to damage from static electricity and may be disposed in the non-display area NA. Referring to FIG. 1, the electrostatic discharge circuit ESD may be disposed in the second non-display area NA2. The electrostatic discharge circuit ESD may be configured to be connected to the touch link line 135. The electrostatic discharge circuit ESD is disposed between the bending area BA and the pad area PA, so that a part of the non-display area NA is folded toward the rear surface of the display device 100 to minimize the non-display area such as the pad area PA, etc., but is not limited thereto. In addition, the electrostatic discharge circuit ESD may be disposed adjacent to both sides of the driving IC COP, but is not limited thereto, and may be disposed at various positions. The electrostatic discharge circuit ESD will be described in more detail with reference to FIGS. 3 and 5.

Figure 2:
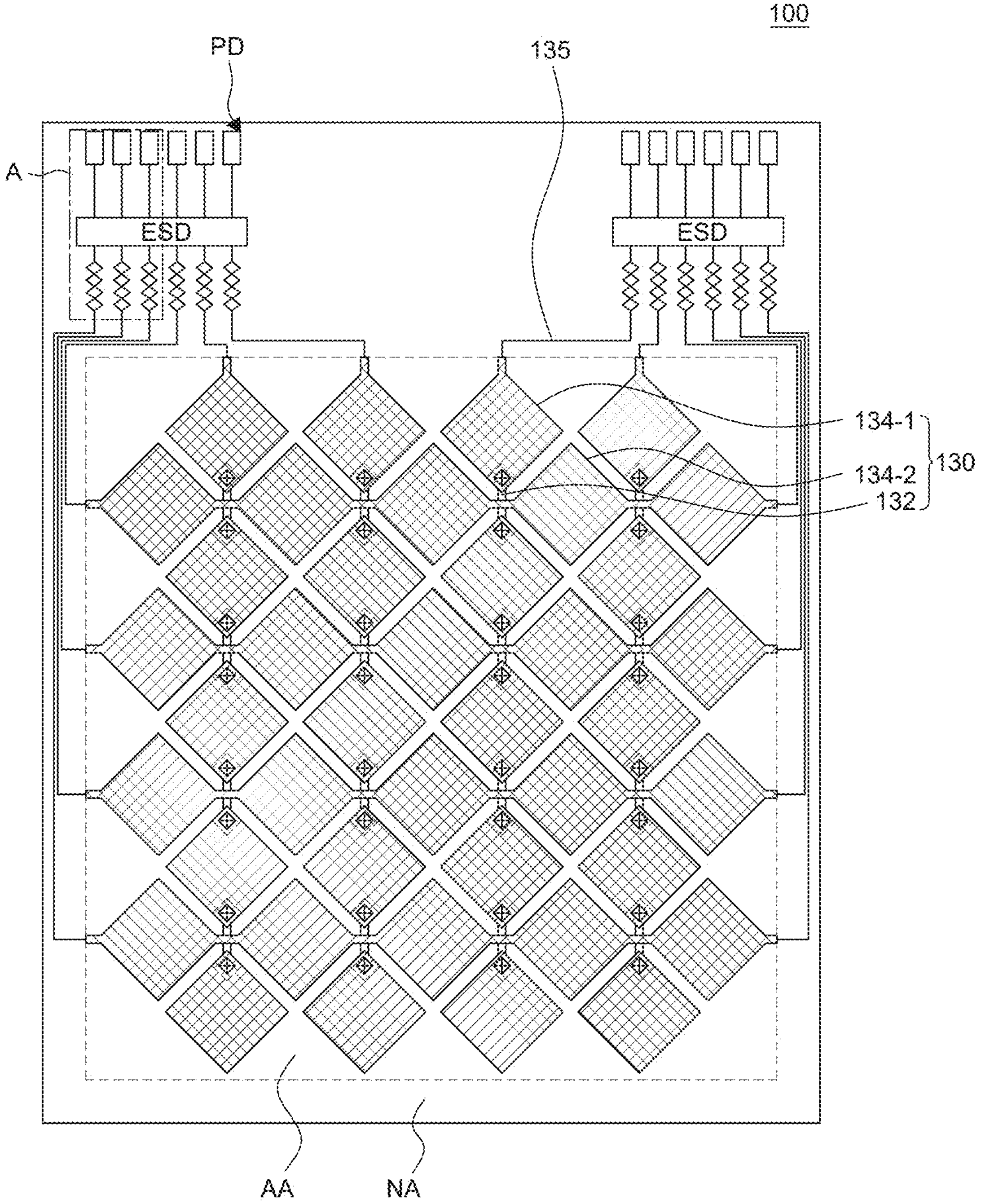
FIG. 2 is a diagram schematically illustrating a touch sensing unit of a display device according to an aspect of the present disclosure.

FIG. 2 is a diagram schematically illustrating a touch sensing unit which may be applied to a display device according to an aspect of the present disclosure. In FIG. 2, among various components of the display device 100, only the substrate 101, the touch sensing unit 130, the touch link line 135, the electrostatic discharge circuit ESD, and the plurality of pads PD are illustrated for purposes of description.

The touch sensing unit 130 is disposed in the display area AA. The touch sensing unit 130 includes a plurality of touch electrodes 134 and a touch connection electrode 132. The plurality of touch electrodes 134 may include a first touch electrode 134-1 and a second touch electrode 134-2. The external shapes of the first touch electrode 134-1 and the second touch electrode 134-2 may correspond to specific shapes. For example, as illustrated in FIG. 2, the external shapes of the first touch electrode 134-1 and the second touch electrode 134-2 may have mesh patterns including a plurality of rhombus shapes. The first touch electrode 134-1 and the second touch electrode 134-2 may be made of metals or also made of transparent conductive materials such as ITO or IZO, but are not limited thereto. The first touch electrode 134-1 and the second touch electrode 134-2 may be disposed on the same layer. However, in a region where the first touch electrode 134-1 and the second touch electrode 134-2 intersect, the first touch electrodes 134-1 may be separated, and the first touch electrodes 134-1 may be connected to each other by the touch connection electrode 132. A more detailed description of the first touch electrode 134-1, the second touch electrode 134-2, and the touch connection electrode 132 will be described below with reference to FIG. 5. The non-display area NA is an area surrounding the display area AA, and disposed with the plurality of touch link lines 135, the electrostatic discharge circuit ESD, and the plurality of pads PD.

Each of the plurality of touch link lines 135 electrically connects each of the plurality of touch electrodes 134-1 and 134-2 that are disposed in the display area AA to the pad PD of the non-display area NA. In one example, a touch link line 135 may be made of a low-resistance metal material, and when the touch link line 135 is made of the low-resistance conductive material, the resistance may be lowered and a corresponding resistor-capacitor (RC) delay may be reduced.

The plurality of pads PD may include a touch pad and a driving display pad. Only the touch pad is illustrated in FIG. 2, but the present disclosure is not limited thereto. One end of the touch pad is connected to the touch link line 135 and the other end is electrically connected to an external circuit to receive a touch signal from the external circuit or transmit a touch sensing signal to the external circuit.

Meanwhile, referring to FIG. 2, the electrostatic discharge circuit ESD may be disposed in the middle of the touch link line 135. The electrostatic discharge circuit ESD may be disposed between the touch bending pattern BP' of the touch link line 135 and the plurality of pads PD. The electrostatic discharge circuit ESD is connected to the touch link line 135, and when an overvoltage or an overcurrent flows through the touch sensing unit 130, the overvoltage or overcurrent is discharged to the electrostatic discharge circuit ESD to suppress static electricity-related effects and prevent damage to the components of the various components.

Hereinafter, for a more detailed description, the electrostatic discharge circuit ESD will be described with reference to FIG. 3 together.

Figure 3:
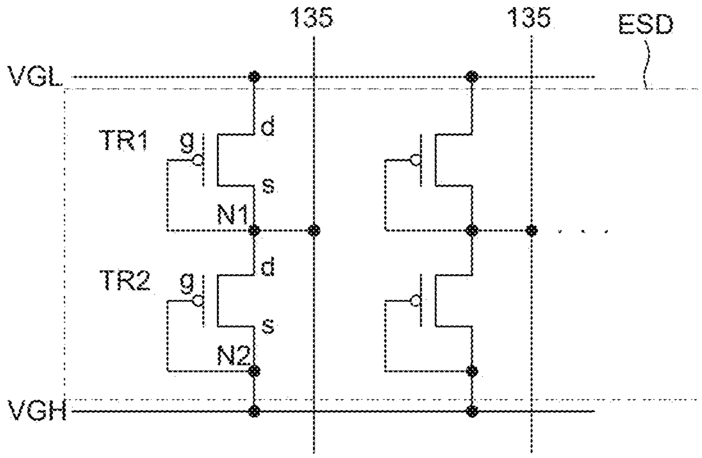
FIG. 3 is a circuit diagram illustrating a configuration of an electrostatic discharge circuit of a display device according to an aspect of the present disclosure.

FIG. 3 is a circuit diagram illustrating a configuration of the electrostatic discharge circuit of the display device according to an aspect of the present disclosure.

Referring to FIG. 3, the electrostatic discharge circuit ESD bypasses static electricity flowing into the touch link line 135. The electrostatic discharge circuit ESD includes a plurality of sub-transistors. The plurality of sub-transistors of the electrostatic discharge circuit ESD includes a first sub-transistor TR1 and a second sub-transistor TR2, which are connected in series to each other. Each of the first sub-transistor TR1 and the second sub-transistor TR2 includes a gate electrode g, a source electrode s, and a drain electrode d.

The drain electrode d of the first sub-transistor TR1 may be connected to a gate low line VGL. The source electrode s of the first sub-transistor TR1 may be connected to a first node N1 to be connected to the touch link line 135. The gate electrode g of the first sub-transistor TR1 may be connected to the first node N1 to be connected to the source electrode s of the first sub-transistor TR1 and the touch link line 135.

The source electrode s of the second sub-transistor TR2 may be connected to a second node N2 to be connected to a gate high line VGH. The drain electrode d of the second sub-transistor TR2 may be connected to the first node N1 to be connected to the source electrode s and the gate electrode g of the first sub-transistor TR1 and the touch link line 135. The gate electrode g of the second sub-transistor TR2 may be connected to the second node N2 to be connected to the source electrode s of the second sub-transistor TR2 and the gate high line VGH.

One first sub-transistor TR1 and one second sub-transistor TR2 having the above-described connection structure may be configured to be connected to one touch link line 135. That is, one first sub-transistor TR1 and one second sub-transistor TR2 may correspond to one touch link line 135.

Specifically, the sub-transistors of the electrostatic discharge circuit ESD may include gate electrodes, active layers, source electrodes, and drain electrodes which are disposed on the same layer and made of the same material as the gate electrode, an active layer, the source electrode, and the drain electrode of the transistor of the display area AA, respectively. In addition, the electrostatic discharge circuit ESD may also include a discharge connection electrode which is disposed on the same layer and made of the same material as the touch connection electrode 132 of the display area AA, and the touch link line 135 may be in contact with the discharge connection electrode to be electrically connected to the sub-transistors.

In a detailed operation of the electrostatic discharge circuit ESD, when a voltage greater than a maximum threshold is generated in the touch link line 135 due to static electricity, etc., while the second sub-transistor TR2 connected to the gate high line VGH and the touch link line 135 is turned on, a current generated by static electricity may flow to the gate high line VGH. On the contrary, when a voltage smaller than the minimum threshold is generated in the touch link line 135 due to static electricity, etc., while the first sub-transistor TR1 connected to the gate low line VGL and the touch link line 135 is turned on, the current generated by the static electricity may flow to the gate low line VGL.

Figure 4:
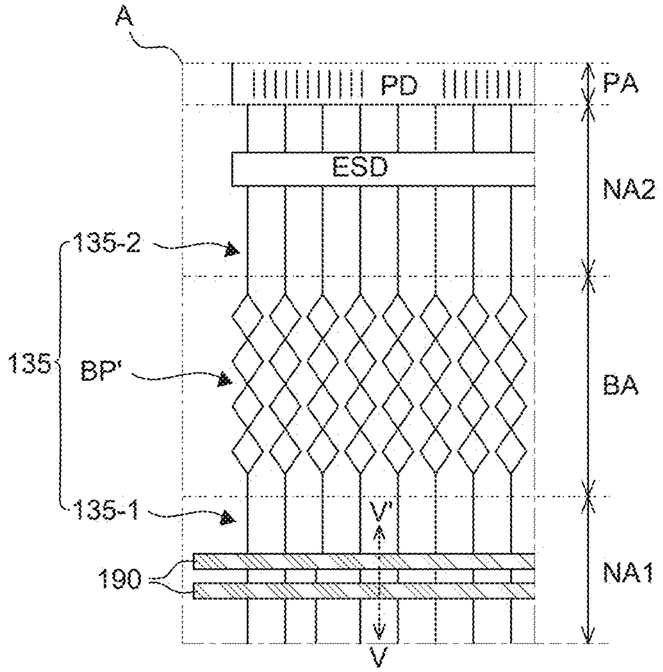
FIG. 4 is an enlarged view of area A of FIG. 2 according to an aspect of the present disclosure.

FIG. 4 is an enlarged view of an area A of FIG. 2, and specifically, a view schematically illustrating a part of the non-display area of the display device according to an aspect of the present disclosure. Among various components of the display device 100, only the substrate 101, the plurality of touch link lines 135, the electrostatic discharge circuit ESD, the plurality of pads PD, and a dam 190 are illustrated for the purposes of description.

Referring to FIG. 4, as described above, in the non-display area NA includes various lines and circuits, and the like, for driving the display unit disposed in the display area AA. In some aspects, the non-display area NA may comprise the first non-display area NA1, the bending area BA, the second non-display area NA2, and the pad area PA.

The first non-display area NA1 is an area extending from the display area AA, and the first line LLA of the data link line and the first touch link line 135-1 may be disposed therein. In addition, in the first non-display area NA1, the dam 190 may be disposed to suppress an organic layer of an encapsulation layer of the display area AA from spreading to the non-display area NA.

The bending area BA extends from the first non-display area NA1 and may be bendable. The touch bending pattern BP' of the touch link line 135 may be disposed in the bending area BA.

The second non-display area NA2 is an area extending from the bending area BA, and may be disposed with the driving IC COP and the electrostatic discharge circuit ESD. Referring to FIG. 4, the electrostatic discharge circuit ESD in the second non-display area NA2 may be configured to be connected to the second touch link line 135-2.

The pad area PA is an area extending from the second non-display area NA2, and may be disposed with the plurality of pads PD. The touch link line 135 is connected to a touch pad among the plurality of pads PD, and the touch link line 135 may receive signals from the plurality of touch pads to transmit the signals to the touch sensing unit 130.

Hereinafter, a specific cross-sectional structure of the display device 100 will be described in detail with reference to FIG. 5.

Figure 5:
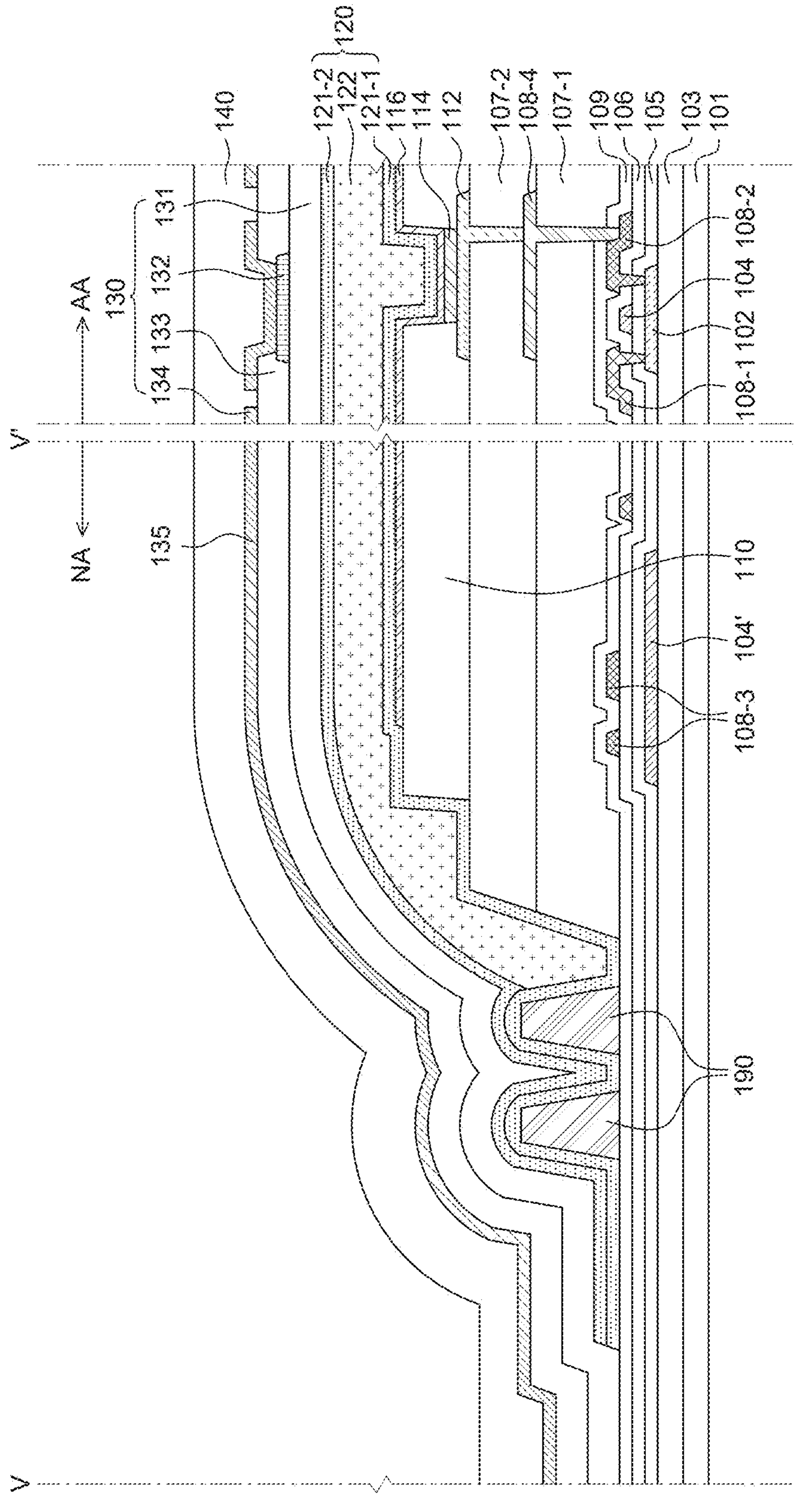
FIG. 5 is a schematic partial cross-sectional view of a display device according to line V-V' of FIG. 4 and a display area of the display device according to an aspect of the present disclosure.

FIG. 5 is a schematic partial cross-sectional view of the display device according to a line V-V' of FIG. 4 and the display area of the display device.

Referring to FIG. 5, the substrate 101 supports various components of the display device 100. The substrate 101 may be formed of a transparent insulating material, for example, glass or plastic.

A buffer layer 103 may be positioned on the substrate 101. The buffer layer 103 is a layer for protecting the transistor from impurities such as alkali ions and the like which leak from the substrate 101 or the lower layers. The buffer layer 103 may be made of silicon oxide (SiOx), silicon nitride (SiNx), or a multilayer thereof.

The transistor is disposed on the buffer layer 103. The transistor includes an active layer 102, a gate electrode 104, a source electrode 108-1, and a drain electrode 108-2.

The active layer 102 is disposed on the buffer layer 103. The active layer 102 may be formed of polysilicon (p-Si), amorphous silicon (a-Si), or an oxide semiconductor, but is not limited thereto.

A gate insulating layer 105 is disposed on the buffer layer 103 and the active layer 102. The gate insulating layer 105 may be made of silicon oxide (SiOx), silicon nitride (SiNx), or a multilayer thereof.

The gate electrode 104 is disposed on the gate insulating layer 105. The gate electrode 104 is disposed on the gate insulating layer 105 to overlap with the active layer 102. The gate electrode 104 may be formed of various conductive materials, for example, magnesium (Mg), aluminum (Al), nickel (Ni), chromium (Cr), molybdenum (Mo), tungsten (W), gold (Au), alloys thereof, or the like, but is not limited thereto.

An interlayer insulating layer 106 is disposed on the gate insulating layer 105 and the gate electrode 104. The gate interlayer insulating layer 106 may be made of silicon oxide (SiOx), silicon nitride (SiNx), or a multilayer thereof.

The source electrode 108-1 and the drain electrode 108-2 are disposed on the interlayer insulating layer 106. The source electrode 108-1 and the drain electrode 108-2 are electrically connected to the active layer 102 through contact holes formed in the gate insulating layer 105 and the interlayer insulating layer 106. The source electrode 108-1 and the drain electrode 108-2 may be formed of various conductive materials, for example, magnesium (Mg), aluminum (Al), nickel (Ni), chromium (Cr), molybdenum (Mo), tungsten (W), gold (Au), alloys thereof, or the like, but are not limited thereto.

A transistor insulating layer 109 is configured to cover the source electrode 108-1 and the drain electrode 108-2 and form top surface of the transistor. A first planarization layer 107-1 is disposed on the transistor insulating layer 109. The first planarization layer 107-1 protects the transistor and planarizes the upper portion thereof. The first planarization layer 107-1 may be formed of, for example, an organic insulating layer such as benzocyclobutene (BCB) or acryl, but is not limited thereto.

A first connection electrode 108-4 is disposed on the first planarization layer 107-1. The first connection electrode 108-4 is an electrode for connecting the drain electrode 108-2 and the first electrode 112, and electrically connected with the drain electrode 108-2 through a contact hole formed in the first planarization layer 107-1. The first connection electrode 108-4 may be formed of various conductive materials, for example, magnesium (Mg), aluminum (Al), nickel (Ni), chromium (Cr), molybdenum (Mo), tungsten (W), gold (Au), alloys thereof, or the like, but is not limited thereto.

A second planarization layer 107-2 is disposed on the first planarization layer 107-1 and the first connection electrode 108-4. The second planarization layer 107-2 planarizes the upper portion of the first connection electrode 108-4. The second planarization layer 107-2 may be formed of, for example, an organic insulating layer such as benzocyclobutene (BCB) or acryl, but is not limited thereto. The organic light emitting diode includes the first electrode 112, an organic light emitting layer 114, and a second electrode 116.

The first electrode 112 is formed on the second planarization layer 107-2. The first electrode 112 is electrically connected to the first connection electrode 108-4 through a contact hole of the second planarization layer 107-2. Accordingly, the first electrode 112 may be electrically connected to the drain electrode 108-2 of the transistor through the first connection electrode 108-4. When the display device 100 is a top emission type, the first electrode 112 may include a transparent conductive layer and a reflective layer on the transparent conductive layer. The transparent conductive layer may be made of, for example, a transparent conductive oxide such as ITO or IZO, and the reflective layer may be made of, for example, silver (Ag), aluminum (Al), gold (Au), molybdenum (Mo), tungsten (W), chromium (Cr), alloys thereof, or the like. The first electrode 112 may also be referred to as an anode.

A bank 110 is formed in the remaining area except for a light emitting area. Accordingly, the bank 110 may expose the first electrode 112 corresponding to the light emitting area. The bank 110 may be made of an inorganic insulating material such as a silicon nitride film (SiNx) or a silicon oxide film (SiOx) or an organic insulating material such as BCB, an acrylic resin, or an imide resin, but is not limited thereto.

The organic light emitting layer 114 is disposed on the first electrode 112 exposed by the bank 110. The organic light emitting layer 114 may include a light emitting layer, an electron injection layer, an electron transport layer, a hole transport layer, a hole injection layer, and the like. The organic light emitting layer 114 may also be configured in a structure having a single light emitting layer that emits one light, or in a structure having a plurality of light emitting layers to emit white light.

The second electrode 116 is disposed on the organic light emitting layer 114. When the display device 100 is a top emission type, the second electrode 116 may be made of a thin metal material, or may be made of ytterbium (Yb), or the like. The second electrode 116 may also be referred to as a cathode.

The encapsulation layer 120 is disposed on the second electrode 116. The encapsulation layer 120 may protect the organic light emitting diode from moisture and oxygen. When the organic light emitting diode is exposed to moisture or oxygen, a pixel shrinkage phenomenon in which the organic light emitting diode is reduced may occur or dark spots may occur in the light emitting area. The encapsulation layer 120 may also have a structure in which an organic layer 122 and a first inorganic layer 121-1 and a second inorganic layer 121-2 are alternately stacked. In this case, the first inorganic layer 121-1 and the second inorganic layer 121-2 serve to block penetration of moisture or oxygen, and the organic layer 122 serves to planarize the upper portion of the first inorganic layer 121-1. However, the configuration of the encapsulation layer 120 is not limited thereto.

The dam 190 is disposed in the non-display area NA to block the flow of the organic layer 122 constituting the encapsulation layer 120. Specifically, the dam 190 may be disposed to surround the periphery of the display area AA to block the flow of the organic layer 122 constituting the encapsulation layer 120. In addition, the dam 190 may be disposed in the non-display area NA to block the flow of the organic layer 122 so that the organic layer 122 constituting the encapsulation layer 120 does not penetrate into the pad area PA.

Various circuits and lines may be disposed in the non-display area NA. These various circuits and lines include a gate electrode 104' made of the same material as the gate electrode 104, and source and drain metals 108-3 made of the same material as the source electrode 108-1 and the drain electrode 108-2, but are not limited thereto.

Because the thickness and/or width of the display device may be increased by combining a panel-type touch sensor, research has been conducted to dispose the touch sensor inside the display device method for disposing the touch sensing unit 130 on the encapsulation layer 120 has been developed. Such a type of built-in touch sensor may be referred to as a touch-sensor on encapsulation (ToE).

Referring to FIG. 5, a touch buffer layer 131 is disposed on the encapsulation layer 120. The touch buffer layer 131 may be formed of an inorganic film, for example, silicon oxide (SiOx), silicon nitride (SiNx), or a multilayer thereof. The touch buffer layer 131 may function to suppress the encapsulation layer 120 from being damaged during the manufacturing of the touch sensing unit 130.

A touch connection electrode 132 may be disposed on the touch buffer layer 131. The touch connection electrode 132 is disposed at a point where the touch electrodes 134 are arranged in different directions and intersect to connect the touch electrodes 134 arranged in any one direction. The touch connection electrode 132 may be formed of a transparent conductive layer, for example, a transparent conductive oxide such as ITO or IZO.

A touch insulating layer 133 may be disposed on the touch connection electrode 132 and the touch buffer layer 131. The touch insulating layer 133 may insulate the touch connection electrode 132 and the touch electrode 134 from each other. The touch insulating layer 133 may be formed of an inorganic film, for example, silicon oxide (SiOx), silicon nitride (SiNx), or a multilayer thereof.

The touch electrode 134 and the touch link line 135 may be disposed on the touch insulating layer 133. The touch electrode 134 may extend in two directions crossing each other as illustrated in FIG. 2. The first touch electrode 134-1 may be disposed in a direction parallel to the data line, and the second touch electrode 134-2 may be disposed in a direction parallel to the gate line. In this case, the touch electrode 134 may have a mesh structure that is a network-type structure, but is not limited thereto.

The touch link line 135 is connected to a circuit for driving the touch sensing unit 130 through the pad PD. The touch link line 135 transmits a control signal of the circuit for driving the touch sensing unit 130 and the like to the touch electrode 134, and may transmit a signal sensed by the touch electrode 134 and the like to the circuit for driving the touch sensing unit 130. In addition, as described above, the touch link line 135 may be connected to the electrostatic discharge circuit ESD in the second non-display area NA2.

The electrostatic discharge circuit ESD may include a plurality of sub-transistors that include gate electrodes, active layers, source electrodes, and drain electrodes which are disposed on the same layer and made of the same material as the gate electrode 104, the active layer 102, the source electrode 108-1, and the drain electrode 108-2 of the transistor of the display area AA, respectively. In addition, the electrostatic discharge circuit ESD may also include a discharge connection electrode which is disposed on the same layer and made of the same material as the first connection electrode 108-4 of the display area AA, and the discharge connection electrode may be connected to the drain electrodes of the sub-transistors. The touch link line 135 may be connected to the corresponding discharge connection electrode through a contact hole and is electrically connected to the sub-transistors of the electrostatic discharge circuit ESD.

The touch planarization layer 140 is disposed above the touch insulating layer 133 and the touch electrode 134. The touch planarization layer 140 covers the touch insulating layer 133 and the touch electrode 134 so as not to be exposed to the outside, and protects the touch insulating layer 133 and the touch electrode 134 from moisture and foreign materials. In addition, the touch planarization layer 140 may planarize the upper portion of the touch electrode 134.

The electrostatic discharge circuit ESD of the display device 100 according to an aspect of the present disclosure may be connected to the touch link line 135 to discharge static electricity generated by the touch sensing unit 130. Accordingly, when a large charge due to static electricity is inputted from one end of the plurality of electrostatic discharge circuits ESD, the transistors constituting the electrostatic discharge circuits ESD absorb the static electricity, and as a result, suppress the static electricity from flowing into the touch link line 135 or the voltage lines VGL and VGH connected to the electrostatic discharge circuits ESD.

When the user's touch is input, static electricity may flow into the touch sensing unit 130 together with the user's touch, and in this case, the static electricity may flow along the touch electrode 134 or the touch link line 135 of the touch sensing unit 130. The static electricity flowing based on the user's touch flows along the touch link line 135, and if the electrostatic discharge circuits ESD are disposed on the path, the static electricity may be absorbed in the electrostatic discharge circuits ESD. That is, in the display device 100 according to the aspect of the present disclosure, the electrostatic discharge circuits ESD is capable of discharging the static electricity flowing into the touch sensing unit 130, and the display device 100 is prevented from being damaged due to the static electricity flowing into the touch electrode 134 and the touch link line 135.

In addition, the electrostatic discharge circuits ESD may be damaged in the process of discharging the static electricity that is accumulated in the touch sensing unit 130, but the electrostatic discharge circuits ESD are covered by the touch planarization layer 140 to minimize the damage that may occur in the process of discharging the static electricity. That is, it is possible to minimize defects caused by electrolytic corrosion of the lines due to abnormal voltage and current that may occur in the electrostatic discharge circuits ESD.

The aspects of the present disclosure may also be described as follows:

According to an aspect of the present disclosure, a display device is disclosed. The display device includes a substrate including a display area and a non-display area. The display device further includes an organic light emitting diode disposed on the substrate. The display device further includes an encapsulation layer disposed on the organic light emitting diode. The display device further includes a touch sensing unit disposed on the encapsulation layer in the display area. The display device further includes a plurality of touch pads disposed in the non-display area. The display device further includes a plurality of touch link lines disposed in the non-display area and each electrically connecting the touch sensing unit and any one of the plurality of touch pads. The display device further includes an electrostatic discharge circuit disposed in the non-display area and connected to the plurality of touch link lines.

The display device further may include a transistor disposed between the substrate and the organic light emitting diode in the display area. The electrostatic discharge circuit may include a plurality of sub-transistors having gate electrodes, active layers, source electrodes, and drain electrodes that are disposed on the same layer and made of the same material as a gate electrode, an active layer, a source electrode, and a drain electrode of the transistor, respectively.

The plurality of sub-transistors may include a first sub-transistor and a second sub-transistor connected in series to each other.

The first sub-transistor may be connected to one touch link line among the plurality of touch link lines and a gate low line transmitting a gate low voltage, and the second sub-transistor may be connected to the one touch link line and a gate high line transmitting a gate high voltage.

The source electrode of the first sub-transistor, the gate electrode of the first sub-transistor, and the drain electrode of the second sub-transistor may be connected to the one touch link line. The drain electrode of the first sub-transistor may be connected to the gate low line. The source electrode and the gate electrode of the second sub-transistor may be connected to the gate high line.

The display device further may include a plurality of gate link lines and a plurality of data link lines disposed in the non-display area. The display device further may include a driving IC disposed in the non-display area and connected to the plurality of gate link lines and the plurality of data link lines. The plurality of touch link lines may be disposed adjacent to both sides of the driving IC.

The driving IC may be mounted on the substrate in a chip on plastic (COP) method.

The non-display area may include a bending area and a pad area. The electrostatic discharge circuit may be disposed between the bending area and the pad area.

The T display device further may include a touch planarization layer disposed on the touch sensing unit. The touch planarization layer may cover an upper portion of the electrostatic discharge circuit.

According to another aspect of the present disclosure, there is provided a display device. The display device includes a substrate including a display area and a non-display area. The display device further includes a touch sensing unit including a touch electrode, and a connection electrode. the display device further includes a touch link line disposed in the non-display area and electrically connected to the touch sensing unit. The display device further includes a touch pad disposed in the non-display area. The display device further includes an electrostatic discharge circuit disposed in the non-display area. The touch link line is electrically connected to the touch pad via the electrostatic discharge circuit.

The electrostatic discharge circuit may include a plurality of sub-transistors connected in series. The plurality of sub-transistors may be connected to the touch link line.

The display device may further include a data driving IC disposed in the non-display area. The electrostatic discharge circuit may be disposed adjacent to both sides of the data driving IC.

The non-display area may include a bending area and a pad area. The electrostatic discharge circuit may be disposed between the bending area and the pad area.

Although the aspects of the present disclosure have been described in detail with reference to the accompanying drawings, the present disclosure is not limited thereto and may be embodied in many different forms without departing from the technical concept of the present disclosure. Therefore, the aspects of the present disclosure are provided for illustrative purposes only but not intended to limit the technical concept of the present disclosure. The scope of the technical concept of the present disclosure is not limited thereto. Therefore, it should be understood that the above-described aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
a substrate including a display area and a non-display area, the non-display area including a first non-display area, a bending area, a second non-display area and a pad area, the bending area disposed between the first non-display area and the second non-display area, and the second non-display area disposed between the bending area and the pad area;
a transistor disposed on the substrate in the display area;
an organic light emitting diode disposed on the transistor in the display area;
an encapsulation layer disposed on the organic light emitting diode and including a first inorganic layer, a second inorganic layer and an organic layer disposed between the first inorganic layer and the second inorganic layer;
a dam disposed on the substrate in the first non-display area;
a touch sensing unit disposed on the encapsulation layer in the display area; and
an electrostatic discharge circuit disposed in the second non-display area.

2. The display device of claim 1, wherein the touch sensing unit comprises a plurality of touch electrode rows, a plurality of touch electrode columns and a plurality of touch connection electrodes,
wherein each of the touch electrode rows includes at least one second touch electrode,
wherein each of the touch electrode columns includes a plurality of first touch electrodes connected to each other by at least one of the plurality of touch connection electrodes.

3. The display device of claim 2, wherein the first touch electrode and the second touch electrode have mesh patterns.

4. The display device of claim 1, further comprising:
a plurality of touch link lines disposed in the non-display area and each electrically connected to the touch sensing unit, and
a plurality of pads disposed in the pad area.

5. The display device of claim 4, wherein the plurality of touch link lines are disposed on both sides of the substrate in a plan view of the display device.

6. The display device of claim 1, wherein the first inorganic layer and the second inorganic layer extend over the dam and terminate in the first non-display area.

7. The display device of claim 1, further comprising:
a touch buffer layer disposed on the encapsulation layer; and
a touch insulating layer disposed on the touch buffer layer,
wherein the touch buffer layer and the touch insulating layer extend beyond the first inorganic layer and the second inorganic layer in the first non-display area.

8. The display device of claim 4, wherein the electrostatic discharge circuit is connected to the plurality of touch link lines and connected to the plurality of pads.

9. The display device of claim 7, further comprising:
a touch planarization layer disposed on the touch insulating layer and extending in the first non-display area.

10. The display device of claim 4, wherein the dam intersects the plurality of touch link lines in the first non-display area.

11. The display device of claim 4, further comprising:
a plurality of data link lines disposed in the non-display area,
wherein the plurality of data link lines and the plurality of touch link lines include titanium.

12. The display device of claim 4, wherein the plurality of touch link lines include at least one of titanium and aluminum.

13. The display device of claim 1, further comprising:
a plurality of data link lines disposed in the non-display area,
wherein a width of the second non-display area in a direction of extending the plurality of data link lines is greater than a width of the first non-display area in the same direction.

14. The display device of claim 1, wherein the electrostatic discharge circuit comprises a first discharge path for discharging voltages higher than a gate high voltage and a second discharge path for discharging voltages less than a gate low voltage.

15. The display device of claim 1, wherein the electrostatic discharge circuit includes a plurality of sub-transistors having gate electrodes, active layers, source electrodes, and drain electrodes that are disposed on the same layer and made of the same material as a gate electrode, an active layer, a source electrode, and a drain electrode of the transistor.

16. The display device of claim 15, wherein the plurality of sub-transistors includes a first sub-transistor and a second sub-transistor connected in series to each other.

17. The display device of claim 16, wherein the first sub-transistor is connected to a gate low line transmitting a gate low voltage, and
wherein the second sub-transistor is connected to a gate high line transmitting a gate high voltage.

18. A display device comprising:
a substrate including a display area and a non-display area, the non-display area includes a bending area and a pad area;
a transistor disposed on the substrate in the display area;
an organic light emitting diode disposed on the transistor in the display area;
an encapsulation layer disposed on the organic light emitting diode;
at least one dam disposed in the non-display area between the display area and the bending area;
a touch sensing unit disposed on the encapsulation layer in the display area;
a plurality of touch link lines disposed in the non-display area and each directly connected to the touch sensing unit; and
an electrostatic discharge circuit disposed in the non-display area between the bending area and the pad area, and
wherein the at least one dam extends in a direction intersecting at least one of the plurality of touch link lines.

19. The display device of claim 18, wherein the encapsulation layer includes a first inorganic layer, a second inorganic layer and an organic layer disposed between the first inorganic layer and the second inorganic layer, and wherein the first inorganic layer and the second inorganic layer extend over the dam and terminate in the non-display area between the display area and the bending area.

20. The display device of claim 18, further comprising:

a plurality of data link lines disposed in the non-display area between the display area and the pad area; and a driving integrated circuit (IC) disposed in the non-display area further away from the display area than the bending area and connected to the plurality of data link lines.

* * * * *